(12) United States Patent
DeBrosse et al.

(10) Patent No.: US 8,755,213 B2
(45) Date of Patent: Jun. 17, 2014

(54) DECODING SCHEME FOR BIPOLAR-BASED DIODE THREE-DIMENSIONAL MEMORY REQUIRING BIPOLAR PROGRAMMING

(75) Inventors: John K. DeBrosse, Colchester, VT (US); Kailash Gopalakrishnan, San Jose, CA (US); Chung H. Lam, Peekskill, NY (US); Jing Li, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/407,848

(22) Filed: Feb. 29, 2012

(65) Prior Publication Data

US 2013/0223125 A1 Aug. 29, 2013

(51) Int. Cl.
*G11C 11/00* (2006.01)
*G11C 13/00* (2006.01)

(52) U.S. Cl.
CPC .................. *G11C 13/0069* (2013.01)
USPC ..................... 365/148; 365/230.06

(58) Field of Classification Search
CPC ........... G11C 13/0069; G11C 13/0007; G11C 13/0004
USPC ..................... 365/148, 163, 230.06
See application file for complete search history.

(56) References Cited

U.S. PATENT DOCUMENTS

| | | | |
|---|---|---|---|
| 4,617,653 A | 10/1986 | Matsuzaki et al. | 365/230 |
| 4,660,178 A | 4/1987 | Hardee et al. | 365/189 |
| 7,382,647 B1 | 6/2008 | Gopalakrishnan | 365/163 |
| 7,436,698 B2 | 10/2008 | Lin et al. | 365/158 |
| 7,573,736 B2 | 8/2009 | Wang et al. | 365/158 |
| 7,646,626 B2 * | 1/2010 | Parkinson et al. | 365/148 |
| 7,729,163 B2 | 6/2010 | Ramani et al. | 365/163 |
| 7,782,661 B2 | 8/2010 | Yang | 365/158 |
| 2008/0151602 A1 * | 6/2008 | Kato | 365/148 |
| 2010/0085830 A1 | 4/2010 | Shepard | 365/230.06 |
| 2010/0118590 A1 | 5/2010 | Carter et al. | 365/148 |

OTHER PUBLICATIONS

G. W. Burr et al., review the capabilities of ferroelectric, magnetic, phase-change, and resistive random-access memories, including perovskites and solid electrolytes, and finally organic and polymeric memory, IBM J. Res. & Dev. vol. 52 No. 4/5, pp. 449-464 (2008 ).

* cited by examiner

*Primary Examiner* — Huan Hoang
(74) *Attorney, Agent, or Firm* — Ido Tuchman; Vazken Alexanian

(57) ABSTRACT

A system and method for operating a bipolar memory cell array including a bidirectional access diode. The system includes a column voltage. The column voltage switch includes column voltages and an output electrically coupled to the bidirectional access diode. The column voltages include at least one write-one column voltage and at least one write-zero column voltage. The system also includes a row voltage switch. The row voltage switch includes row voltages and an output electrically coupled to the bidirectional access diode. The row voltages include at least one write-one row voltage and at least one write-zero row voltage. The system further includes a column decoder and a row decoder electrically coupled to a select line of the column voltage switch and row voltage switch, respectively. The system includes a write driver electrically coupled to the select lines of the row and column switches.

21 Claims, 12 Drawing Sheets

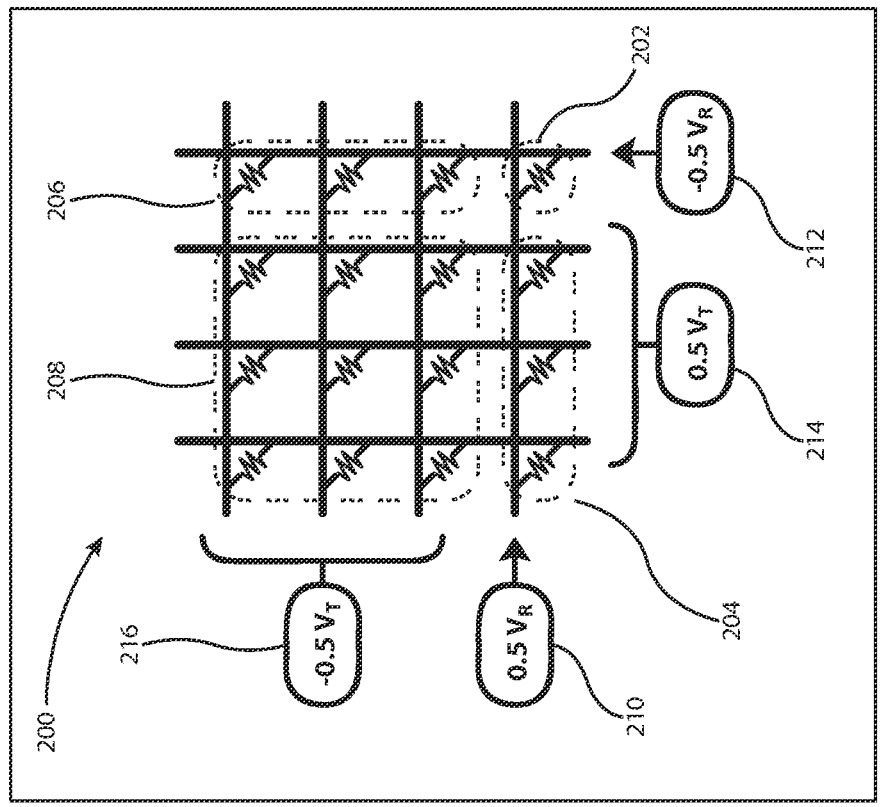
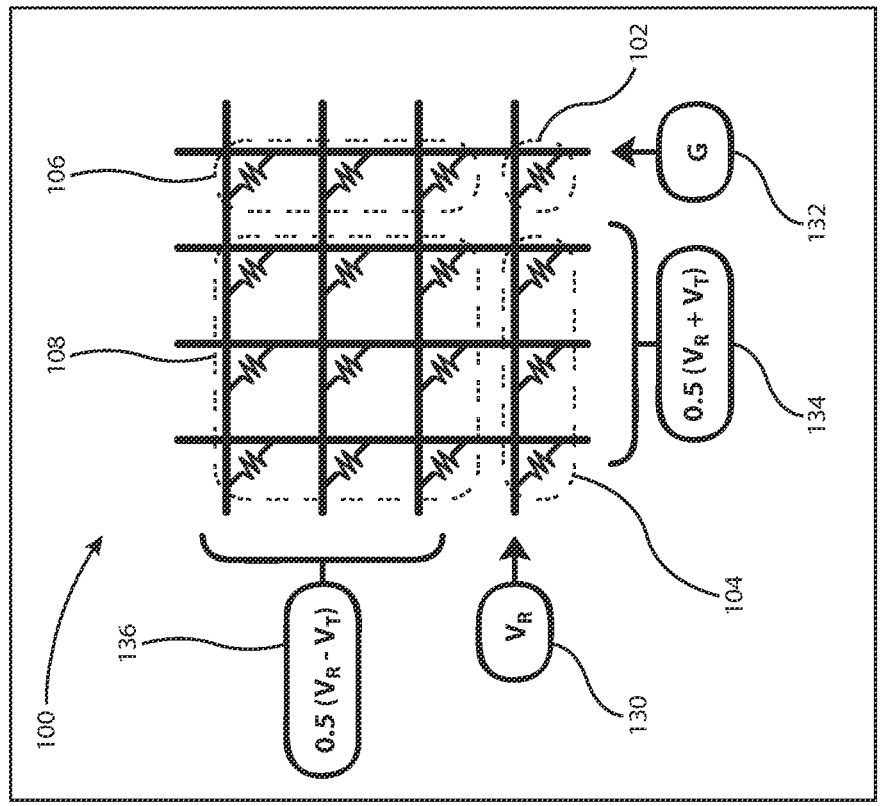

|  | BL's | | WL's | |
| --- | --- | --- | --- | --- |
|  | Select | Non Select | Select | Non Select |
| Read | $V_R$ / $V_{DD}$ | $0.5(V_R - V_B)$ / $V_{SBB}$ | GND / 0 | $0.5(V_R + V_B)$ / $V_{SBB}$ |
| Write "0" | $V_W$ / $V_{PP}$ | $0.5(V_W - V_B)$ / $V_{SBB}$ | GND / 0 | $0.5(V_W + V_B)$ / $V_{SBW}$ |
| Write "1" | $V_W$ / 0 | $0.5(V_W - V_B)$ / $V_{SBW}$ | GND / $V_{PP}$ | $0.5(V_W + V_B)$ / $V_{SBB}$ |
| Standby | $V_{SBB}$ | $V_{SBB}$ | $V_{SBB}$ | $V_{SBB}$ |

DECODING SCHEME FOR BIPOLAR-BASED DIODE THREE-DIMENSIONAL MEMORY REQUIRING BIPOLAR PROGRAMMING

BACKGROUND

This invention relates to memory in semiconductor devices. More particularly, the present invention relates to a system and method for operating memory cells requiring bipolar programming in a three-dimensional array.

A central problem associated with present volatile and non-volatile memory devices is that peripheral circuitry provides a large area overhead on the semiconductor memory chip, which results in less space available for the memory cell array. For example, past solutions for implementing more efficient memory devices involved utilizing multiple semiconductor chips to fashion the memory device or stack bipolar memory cells on top of each other. These solutions, however, regularly experience problems with significant wiring.

Nonvolatile memory solutions are a growing focus for the next generation of memory systems. Where present floating-gate transistor based non-volatile memories satisfy many current enterprise and consumer needs, exponential growth in the amount of digital data generated in the information industry requires next generation of semiconductor memories to increase memory densities while reducing cost.

BRIEF SUMMARY

Floating-gate transistors are difficult and expensive to integrate into the vertical dimension. Resistive random-access memory (RRAM), phase change memory (PCM) and magnetoresistive random-access memory (MRAM) are two-terminal emerging memory technologies presenting new opportunities in integrating memory arrays into the vertical dimension. Integrating memory arrays into the vertical dimensions make possible sharing peripheral circuits of multiple layers of memory arrays on same substrate thus improving the memory area efficiency. In particular, RRAM and MRAM are bipolar programmable memories. Finding a memory design that allows for greater memory cell densities on a semiconductor chip will provide for improved memory array efficiency and reliability.

Accordingly, one example aspect of the present invention is a decoding scheme for a bipolar memory cell array including a bidirectional access diode. The decoding scheme includes a column voltage switch. The column voltage switch includes a plurality of column voltages and an output electrically coupled to the bidirectional access diode. The column voltages include at least one write-one column voltage and at least one write-zero column voltage. The decoding scheme also includes a row voltage switch. The row voltage switch includes a plurality of row voltages and an output electrically coupled to the bidirectional access diode. The row voltages include at least one write-one row voltage and at least one write-zero row voltage. The decoding scheme further includes a column decoder electrically coupled to a select line of the column voltage switch and a row decoder electrically coupled to a select line of the row voltage switch. Additionally, the decoding scheme includes a write driver electrically coupled to the select lines of the row and column switches.

Another aspect of the invention is a method of operating a bipolar memory cell array including a bidirectional access diode. The method includes determining if an operating state of the bipolar memory cell is a select-state or a deselect-state. The method also includes determining if a programming state of the bipolar memory cell is a read-state or a write-state. The method further includes determining if a binary state of the bipolar memory cell is a one-state or a zero-state. A switching step switches an output signal of a column voltage switch to a select read/write-one column voltage if the operating state is the select-state and the programming state is the read-state, or if the operating state is the select-state, the programming state is the write-state, and the binary state is the one-state. Another switching step switches the output signal of the column voltage switch to a select write-zero column voltage if the operating state is the select-state, the programming state is the write-state, and the binary state is the zero-state. Another switching step switches the output signal of the column voltage switch to a deselect read column voltage if the operating state is the deselect-state and the programming state is the read-state. A further switching step switches the output signal of the column voltage switch to a deselect write-one column voltage if the operating state is the deselect-state, the programming state is the write-state, and the binary state is the one-state. Another switching step switches the output signal of the column voltage switch to a deselect write-zero column voltage if the operating state is the deselect-state, the programming state is the write-state, and the binary state is the zero-state. A switching step switches an output signal of a row voltage switch to a select read row voltage if the operating state is the select-state and the programming state is the read-state. Another switching step switches the output signal of the row voltage switch to a select write-one row voltage if the operating state is the select-state, the programming state is the write-state, and the binary state is the one-state. A further switching step switches the output signal of the row voltage switch to a select write-zero row voltage if the operating state is the select-state, the programming state is the write-state, and the binary state is the zero-state. Another switching step switches an output signal of a row voltage switch to a deselect read row voltage if the operating state is the deselect-state and the programming state is the read-state. A further switching step switches the output signal of the row voltage switch to a deselect write-one row voltage if the operating state is the deselect-state, the programming state is the write-state, and the binary state is the one-state. Yet another switching step switches the output signal of the row voltage switch to a deselect write-zero row voltage if the operating state is the deselect-state, the programming state is the write-state, and the binary state is the zero-state.

BRIEF DESCRIPTIONS OF DRAWINGS

FIG. 1C is a diagram of the example bipolar memory cell array utilizing a plurality of bias conditions during a read state.

FIG. 2A is a diagram of an example bipolar memory cell array utilizing a single bias condition during a read state.

FIG. 9 is a table of an optimized power supply scheme for a bipolar memory cell including a bidirectional access diode in accordance with one embodiment of the present invention.

DETAILED DESCRIPTION

Figure 1A:
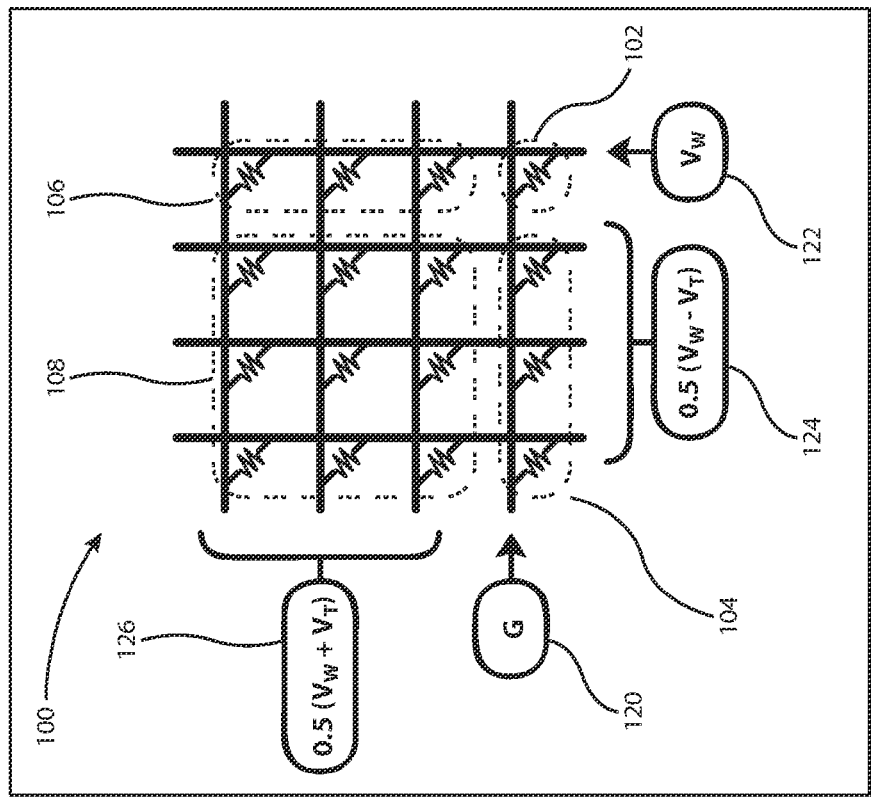
FIG. 1A is a diagram of an example bipolar memory cell array utilizing a plurality of bias conditions during a write-zero state in accordance with one embodiment of the present invention.

The present invention is described with reference to embodiments of the invention, but shall not be limited to the referenced embodiments. Throughout the description of the present invention, references are made to FIGS. 1A through 11. When referring to the figures, like structures and elements shown throughout are indicated with like reference numerals.

Embodiments of the present invention provide possible systems for operating a bipolar memory cell with a bidirectional access diode, and possible methods for selecting from a plurality of bias voltages in such a system. The present invention is applicable to any three-dimensional memory array including bidirectional write operations.

An aspect of the present invention provides a multistage decoding scheme for a bidirectional diode bipolar memory cell. Embodiments of the present invention provide that the first stage decoding scheme elements be directly coupled to the bidirectional access diode. The second stage decoding scheme elements and other circuitry can be shared by a plurality of first stage decoding scheme elements. The bias voltages can be from an external source or on-chip voltage generation circuitry. Such a mechanism is advantageous in providing efficient voltage selection in high-density memory arrays.

In embodiments described in FIGS. 1A through 2C, the row lines in the diagrams represent bit lines in a memory cell array, and the column lines in the diagram represent word lines in a memory cell array. However, one skilled in the art would recognize that the word and bit lines are interchangeable in alternate embodiments of the present invention.

Figure 1B:
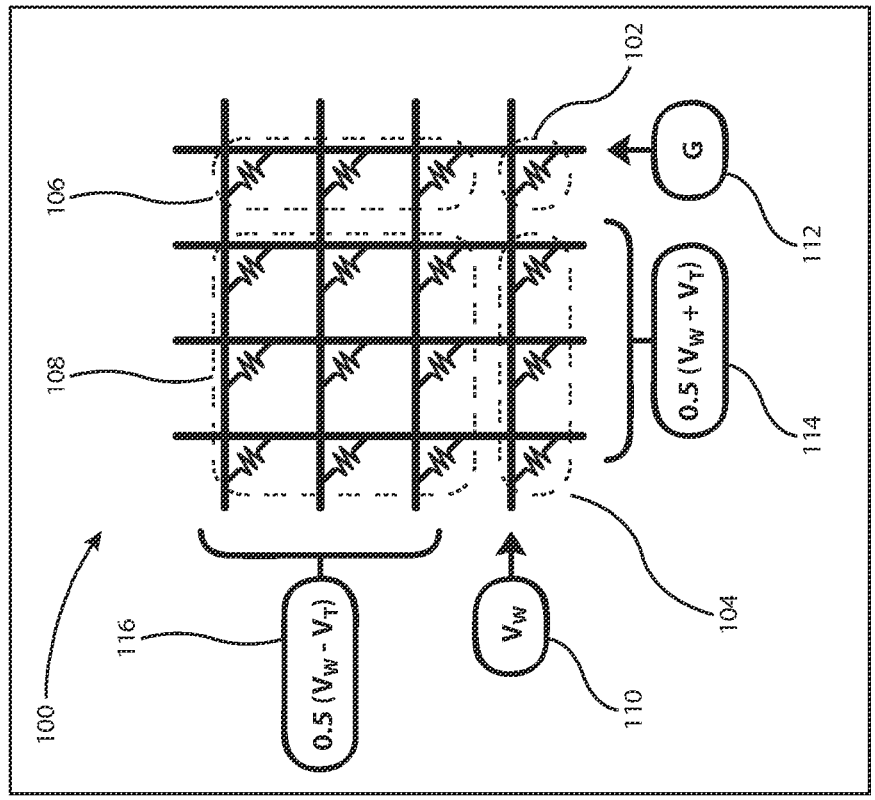
FIG. 1B is a diagram of the example bipolar memory cell array utilizing a plurality of bias conditions during a write-one state.

FIGS. 1A through 1C display three diagrams of an example bipolar memory cell array 100 including bidirectional access diodes in accordance with one embodiment of the present invention. In this embodiment, bias conditions are used to select and deselect the word lines and bit lines. Furthermore, in this embodiment, only positive bias voltages are utilized.

The memory array 100 includes a memory cell in a select state 102, memory cells in a select row 104, memory cells in a select column 106, and memory cells in a deselect state 108.

FIG. 1A is a diagram of the example bipolar memory cell array 100 during a write-zero state. During the write-zero state, the memory cells in a select row 104 and the memory cell in a select state 102 are coupled to a select write-zero row voltage 110. The memory cells in a select column 106 and the memory cell in a select state 102 are coupled to a select write-zero column voltage 112.

Additionally, during the write-zero state the memory cells in a deselect state 108 and the memory cells in a select row 104 are coupled to a deselect write-zero column voltage 114. The memory cells in a deselect state 108 and the memory cells in a select column 106 are coupled to a deselect write-zero row voltage 116.

FIG. 1B is a diagram of the example bipolar memory cell array 100 during a write-one state. During the write-one state, the memory cells in a select row 104 and the memory cell in a select state 102 are coupled to a select write-one row voltage 120. The memory cells in a select column 106 and the memory cell in a select state 102 are coupled to a select write-one column voltage 122.

Additionally, during the write-one state the memory cells in a deselect state 108 and the memory cells in a select row 104 are coupled to a deselect write-one column voltage 124. The memory cells in a deselect state 108 and the memory cells in a select column 106 are coupled to a deselect write-one row voltage 126.

FIG. 1C is a diagram of the example bipolar memory cell array 100 during a read state. During the read state, the memory cells in a select row 104 and the memory cell in a select state 102 are coupled to a select read row voltage 130. The memory cells in a select column 106 and the memory cell in a select state 102 are coupled to a select read column voltage 132.

Additionally, during the read state the memory cells in a deselect state 108 and the memory cells in a select row 104 are coupled to a deselect read column voltage 134. The memory cells in a deselect state 108 and the memory cells in a select column 106 are coupled to a deselect read row voltage 136.

Figure 2C:
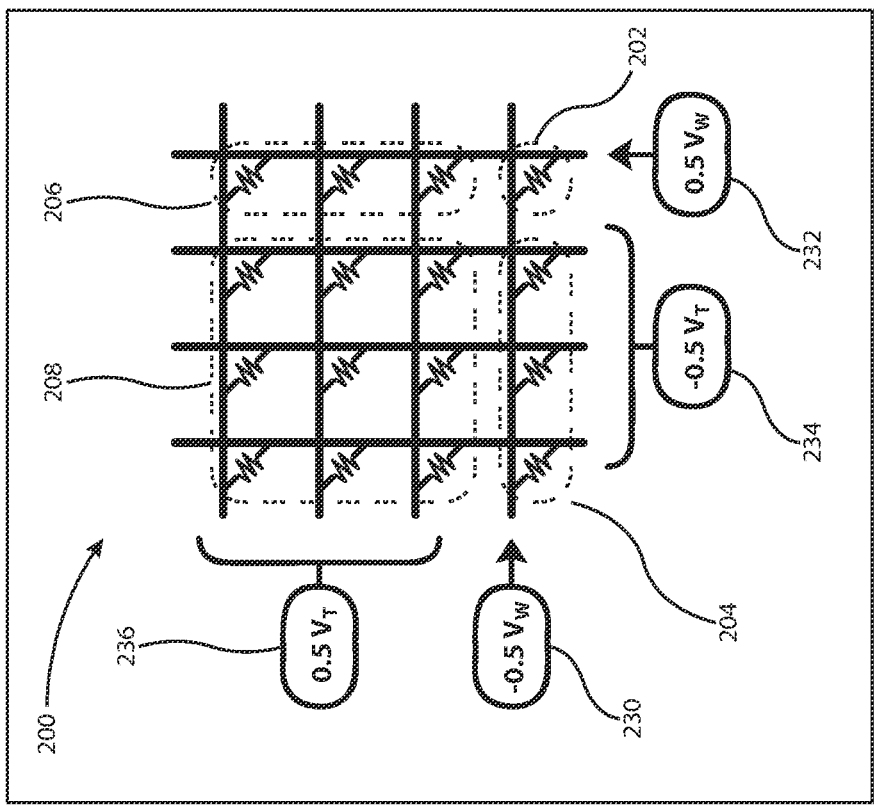
FIG. 2C is a diagram of the example bipolar memory cell array utilizing a single bias condition during a write-one state.
Figure 2B:
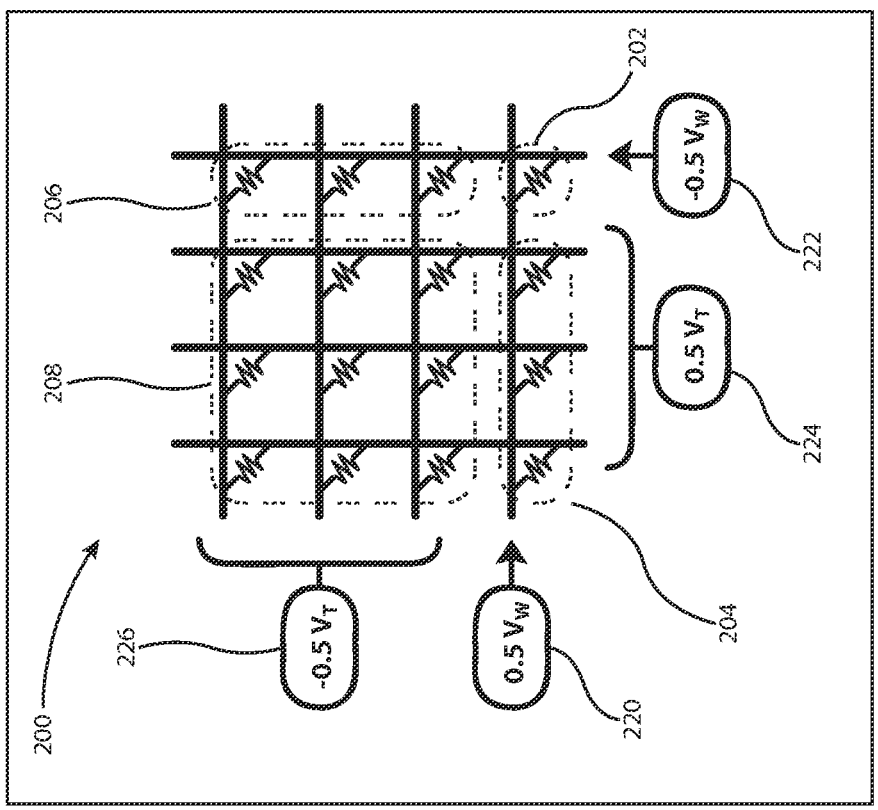
FIG. 2B is a diagram of an example bipolar memory cell array utilizing a single bias condition during a write-zero state in accordance.

FIGS. 2A through 2C display three diagrams of an example bipolar memory cell array 200 including bidirectional access diodes in accordance with one embodiment of the present invention. In this embodiment, a single bias condition is used to select and deselect the word lines and bit lines. Furthermore, in this embodiment, positive and negative bias voltages are utilized.

The memory array 200 includes a memory cell in a select state 202, a plurality of memory cells in a select row 204, a plurality of memory cells in a select column 206, and a plurality of memory cells in a deselect state 208.

FIG. 2A is a diagram of an example bipolar memory cell array 200 during a read state. During the read state, the memory cells in a select row 204 and the memory cell in a select state 202 are coupled to a select read row voltage 210. The memory cells in a select column 206 and the memory cell in a select state 202 are coupled to a select read column voltage 212.

Additionally, during the read state the memory cells in a deselect state 208 and the memory cells in a select row 204 are coupled to a deselect read column voltage 214. The memory cells in a deselect state 208 and the memory cells in a select column 206 are coupled to a deselect read row voltage 216.

FIG. 2B is a diagram of the example bipolar memory cell array 200 during a write-zero state. During the write-zero state, the memory cells in a select row 204 and the memory cell in a select state 202 are coupled to a select write-zero row voltage 220. The memory cells in a select column 206 and the memory cell in a select state 202 are coupled to a select write-zero column voltage 222.

Additionally, during the write-zero state the memory cells in a deselect state 208 and the memory cells in a select row 204 are coupled to a deselect write-zero column voltage 224. The memory cells in a deselect state 208 and the memory cells in a select column 206 are coupled to a deselect write-zero row voltage 226.

FIG. 2C is a diagram of the example bipolar memory cell array 200 during a write-one state. During the write-one state, the memory cells in a select row 204 and the memory cell in a select state 202 are coupled to a select write-one row voltage 230. The memory cells in a select column 206 and the memory cell in a select state 202 are coupled to a select write-one column voltage 232.

Additionally, during the write-one state the memory cells in a deselect state 208 and the memory cells in a select row 204 are coupled to a deselect write-one column voltage 234. The memory cells in a deselect state 208 and the memory cells in a select column 206 are coupled to a deselect write-one row voltage 236.

Figure 3:
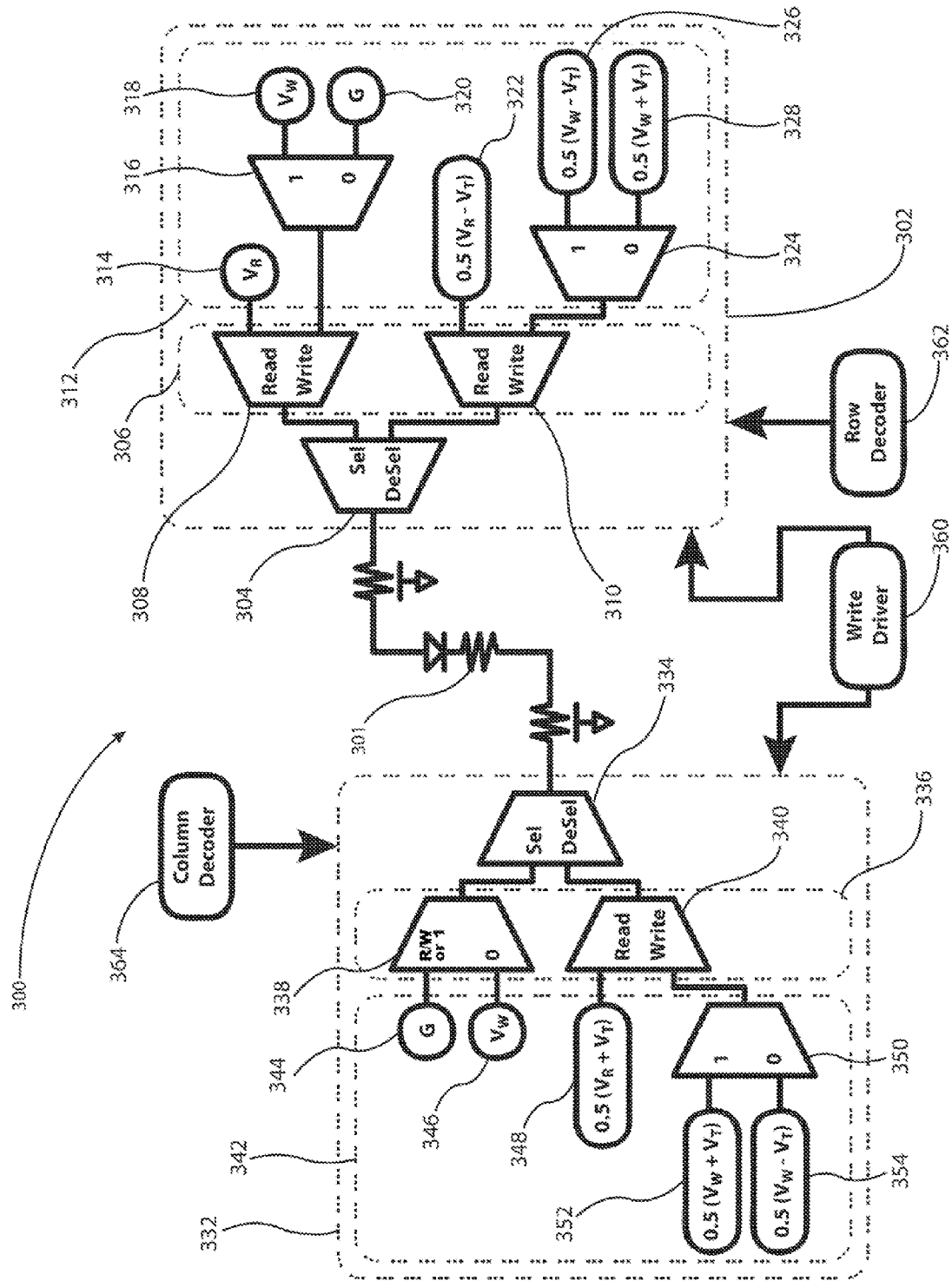
FIG. 3 is a diagram of an example decoding circuit for a bipolar memory cell including a bidirectional access diode in accordance with one embodiment of the present invention.

FIG. 3 is a diagram of an example system for operating a bipolar memory cell including a bidirectional access diode in accordance with one embodiment of the present invention. The system includes a decoding circuit 300, the decoding circuit 300 includes a row voltage switch 302. The row voltage switch 302 includes an output electrically coupled to the bidirectional access diode 301. The bidirectional access diode includes a threshold voltage ($V_T$).

In this embodiment, the row voltage switch 302 includes a first stage row multiplexer 304, wherein an output of the first stage row multiplexer 304 is electrically coupled to the bipolar memory cell 301. The row voltage switch 302 also includes a second stage row switch 306. The second stage row switch 306 includes a second stage select row multiplexer 308, wherein an output of the second stage select row multiplexer 308 is electrically coupled to the first stage row multiplexer 304. The second stage row switch 306 also includes a second stage deselect row multiplexer 310, wherein an output of the second stage deselect row multiplexer 310 is electrically coupled to the first stage row multiplexer 304.

Additionally, the row voltage switch 302 includes a third stage row switch 312. In this embodiment, the third stage row voltage switch 312 includes a select read row voltage 314 electrically coupled to the second stage select row multiplexer 308. The third stage row voltage switch 312 includes a third stage select row multiplexer 316 including an output electrically coupled to the second stage select row multiplexer 308. The third stage select row multiplexer 316 is also electrically coupled to a select write-one row voltage 318 ($V_W$) and a select write-zero row voltage 320. In this embodiment, the select write-zero row voltage 320 is a ground voltage (G).

Furthermore, the third stage row switch 312 includes a deselect read row voltage 322 electrically coupled to the second stage deselect row multiplexer 310. In this embodiment, the deselect read row voltage 322 is equal to one half the difference between the select read row voltage 314 and the threshold voltage ($V_T$). The third stage row switch 312 also includes a third stage deselect row multiplexer 324 including an output electrically coupled to the second stage deselect row multiplexer 310. The third stage deselect row multiplexer 324 is also electrically coupled to a deselect write-one row voltage 326 and a deselect write-zero row voltage 328. In this embodiment, the deselect write-one row voltage 326 is equal to one half the difference between the select write-zero row voltage 320 and the threshold voltage ($V_T$). The deselect write-zero row voltage 328 is equal to one half the sum of the select write-zero row voltage 320 and the threshold voltage ($V_T$).

The decoding circuit 300 also includes a column voltage switch 332. The column voltage switch 332 includes an output electrically coupled to the bidirectional access diode 301. In this embodiment, the column voltage switch 332 includes a first stage column multiplexer 334, wherein an output of the first stage column multiplexer 334 is electrically coupled to the bipolar memory cell 301. The column voltage switch 332 also includes a second stage column switch 336. The second stage column switch 336 includes a second stage select column multiplexer 338, wherein an output of the second stage select column multiplexer 338 is electrically coupled to the first stage column multiplexer 334. The second stage column switch 336 also includes a second stage deselect column multiplexer 340, wherein an output of the second stage deselect column multiplexer 340 is electrically coupled to the first stage column multiplexer 334.

Additionally, the column voltage switch 332 includes a third stage column switch 342. The third stage column voltage switch 342 includes a select read column voltage and a select write-one column voltage. In some embodiments the select read column voltage and the select write-one column voltage are equal. In this embodiment, the select read column voltage and select write-one column voltage are the same voltage supply, a select read/write-one column voltage 344. The select read/write-one column voltage 344 is electrically coupled to the second stage select column multiplexer 338. The select read/write-one column voltage 344 is a ground voltage (G). The third stage column voltage switch 342 includes a select write-zero column voltage 346 ($V_W$) electrically coupled to the second stage select column multiplexer 338. In this embodiment, the select write-zero column voltage 346 is equal to the select write-one row voltage 318.

Furthermore, the third stage column switch 342 includes a deselect read column voltage 348 electrically coupled to the second stage deselect column multiplexer 340. In this embodiment, the deselect read column voltage 348 is equal to one half the sum of the select read row voltage 314 and the threshold voltage ($V_T$). The third stage column switch 342 also includes a third stage deselect column multiplexer 350 including an output electrically coupled to the second stage deselect column multiplexer 340. The third stage deselect column multiplexer 350 is also electrically coupled to a deselect write-one column voltage 352 and a deselect write-zero column voltage 354. In this embodiment, the deselect write-one column voltage 352 is equal to one half the sum of the select write-one row voltage 318 and the threshold voltage ($V_T$). The deselect write-zero column voltage 354 is equal to one half the difference between the select write-one row voltage 318 and the threshold voltage ($V_T$).

The decoding circuit 300 also includes a write driver 360 electrically coupled to a select line of the row voltage switch 302 and column voltage switch 332. The decoding circuit also includes a row decoder 362 electrically coupled to a select line of the row voltage switch 302. The decoding circuit also includes a column decoder 364 electrically coupled to a select line of the column voltage switch 332.

Figure 4:
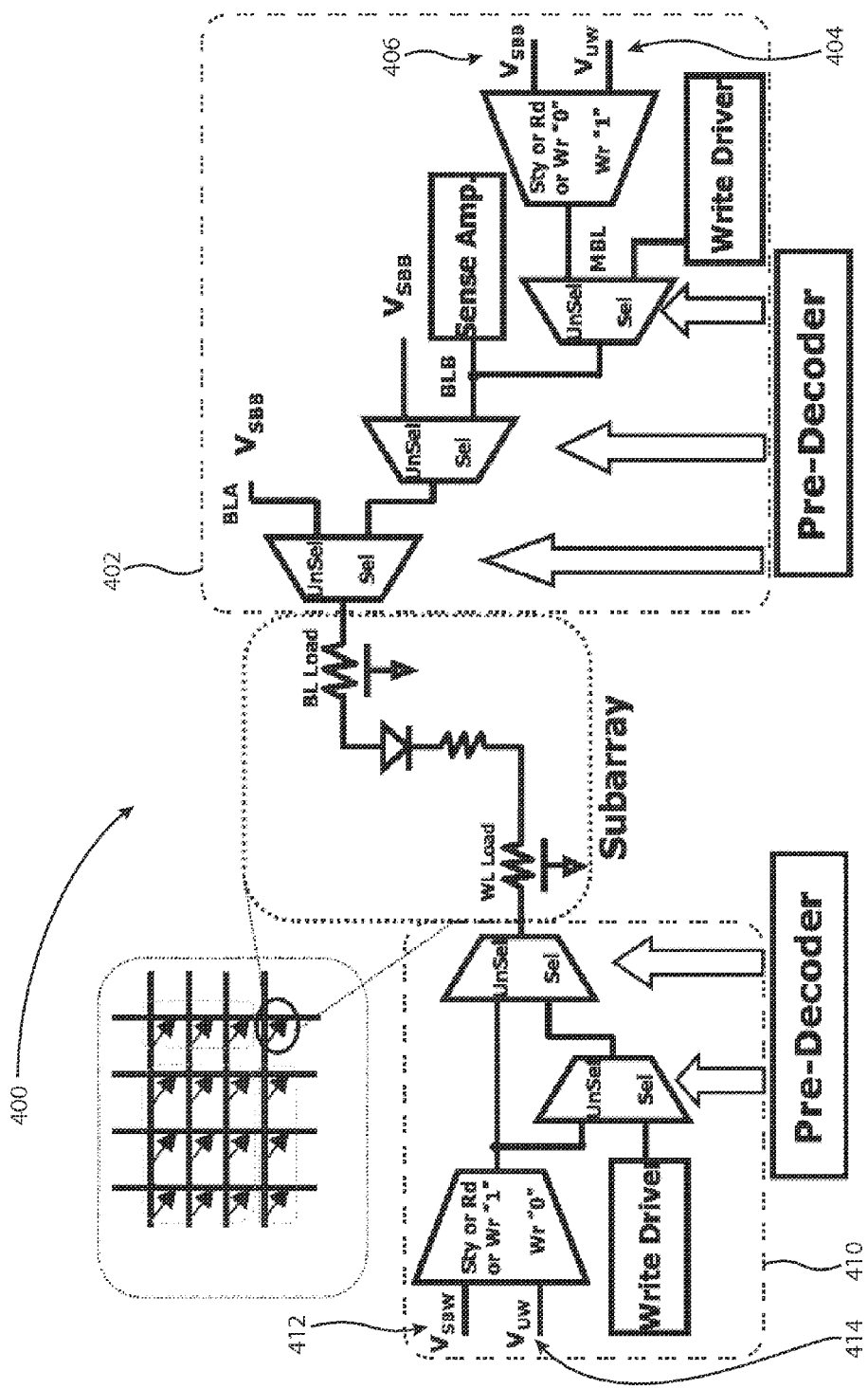
FIG. 4 is a diagram of an example decoding circuit for a bipolar memory cell including a bidirectional access diode in accordance with one embodiment of the present invention.

FIG. 4 is a diagram of an example system for operating a bipolar memory cell including a bidirectional access diode in accordance with one embodiment of the present invention. The system includes a decoding circuit 400, the decoding circuit 400 includes a row voltage switch 402. The row voltage switch includes a write-one row voltage 404 and a write-zero row voltage 406. The decoding circuit 400 also includes a column voltage switch 410. The column voltage switch includes a write-one column voltage 412 and a write-zero column voltage 414.

Figure 5:
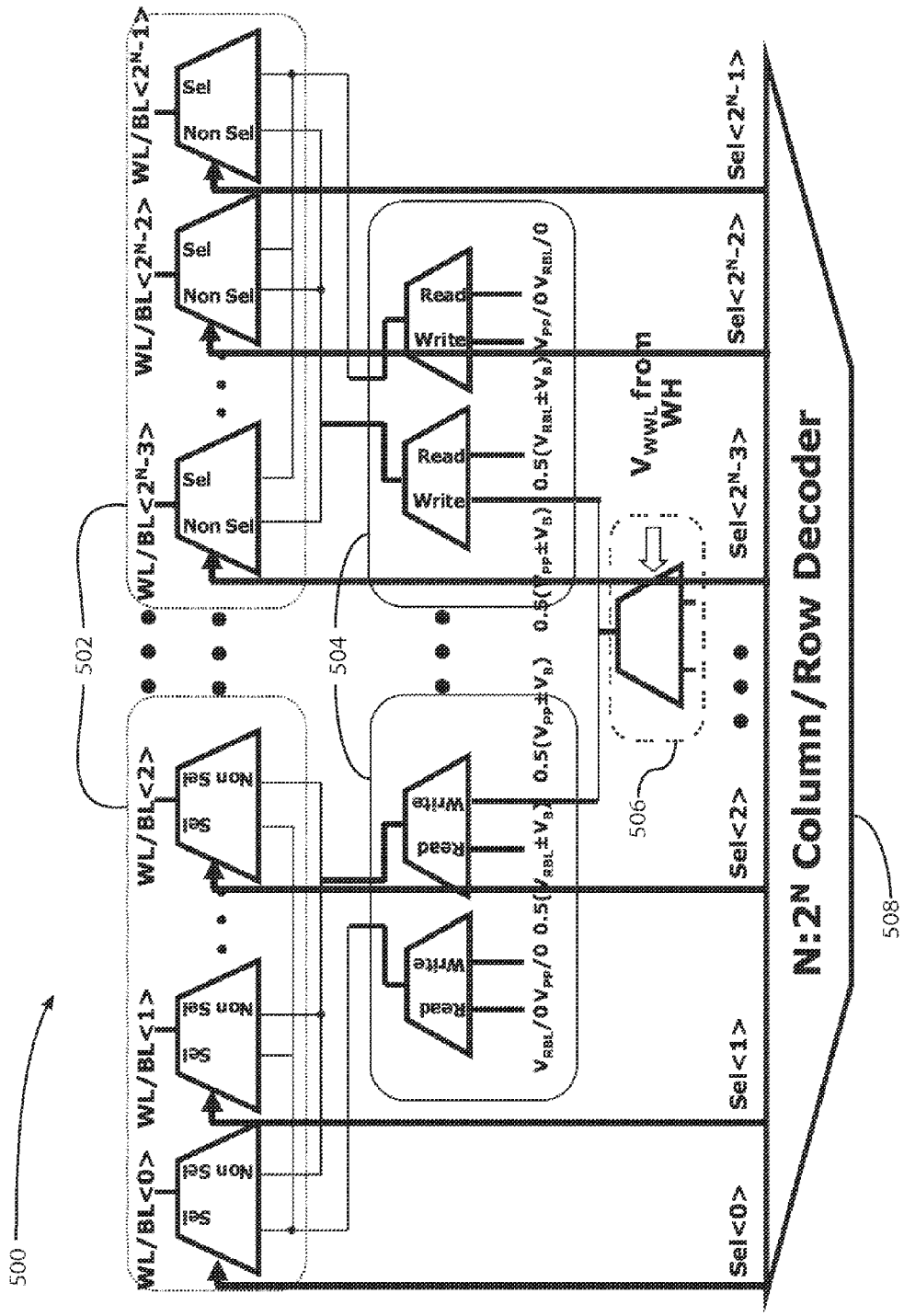
FIG. 5 is a diagram of an example decoding circuit for a bipolar memory cell array including bidirectional access diodes in accordance with one embodiment of the present invention.

FIG. 5 is a diagram of an example system for operating a bipolar memory cell array including bidirectional access diodes in accordance with one embodiment of the present invention. The system includes a decoding circuit 500, the decoding circuit 500 includes a plurality of first stage row/column multiplexers 502. The decoding circuit 500 also includes a plurality of second stage row/column voltage switches 504. The plurality of second stage row/column voltage switches 504 includes outputs electrically coupled to the plurality of first stage row/column multiplexers 502. The decoding circuit 500 further includes a third stage row/column switch 506 including an output electrically coupled to the plurality of second stage row/column voltage switches 504. In this embodiment, the decoding circuit 500 includes a row/column decoder 508 electrically coupled to a select line in the plurality of first stage row/column multiplexers 502. In some embodiments, the second stage and third stage row/column voltage switches are shared between a plurality of first stage row/column multiplexers and memory storage elements.

Figure 6:
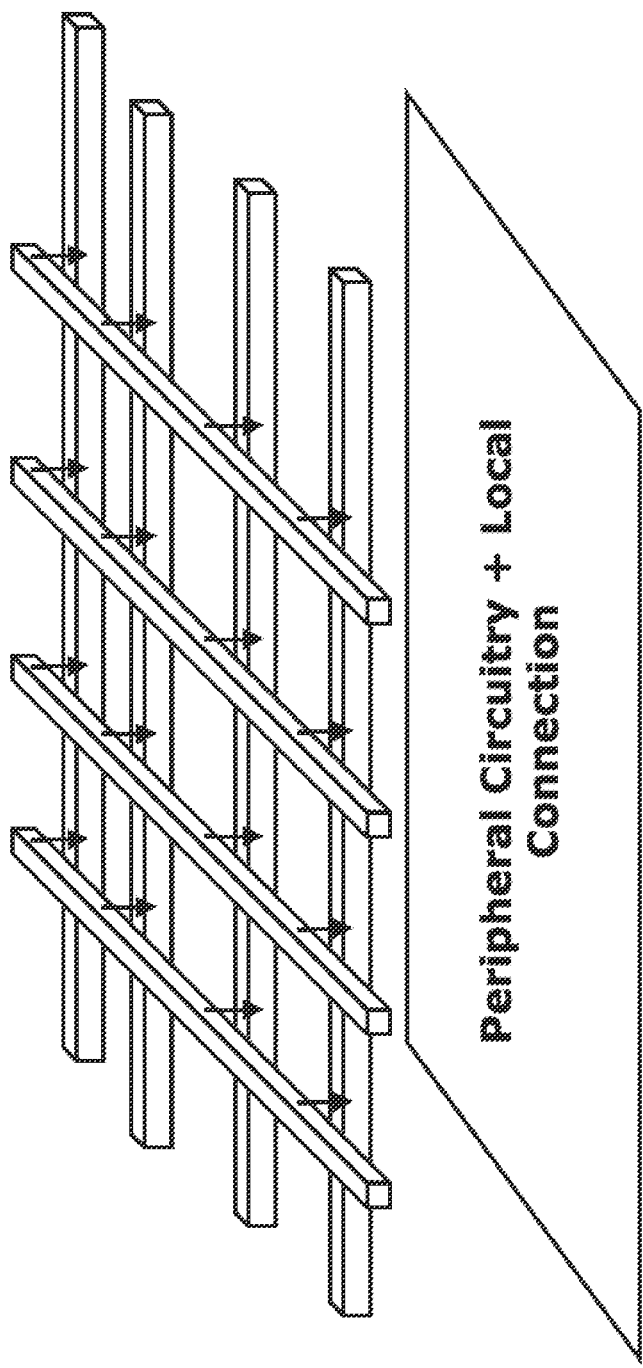
FIG. 6 is a diagram of an example configuration for a bipolar memory cell array including a bidirectional access diode in accordance with one embodiment of the present invention.

FIG. 6 is a diagram of an example configuration for a bipolar memory cell array including a bidirectional access diode in accordance with one embodiment of the present invention. In this embodiment, the circuitry described in the embodiments above are located below the bit line, word line and memory storage elements.

The horizontal bars represent the bit lines in the memory array. The cross bars represent the word lines in the memory array. The downward arrows between the word and bit lines represent the memory storage elements. In some embodiments, the memory storage elements are integrated with the bidirectional access diode between two metal layers. The element below the array represents the decoding circuitry and local connections.

Figure 7:
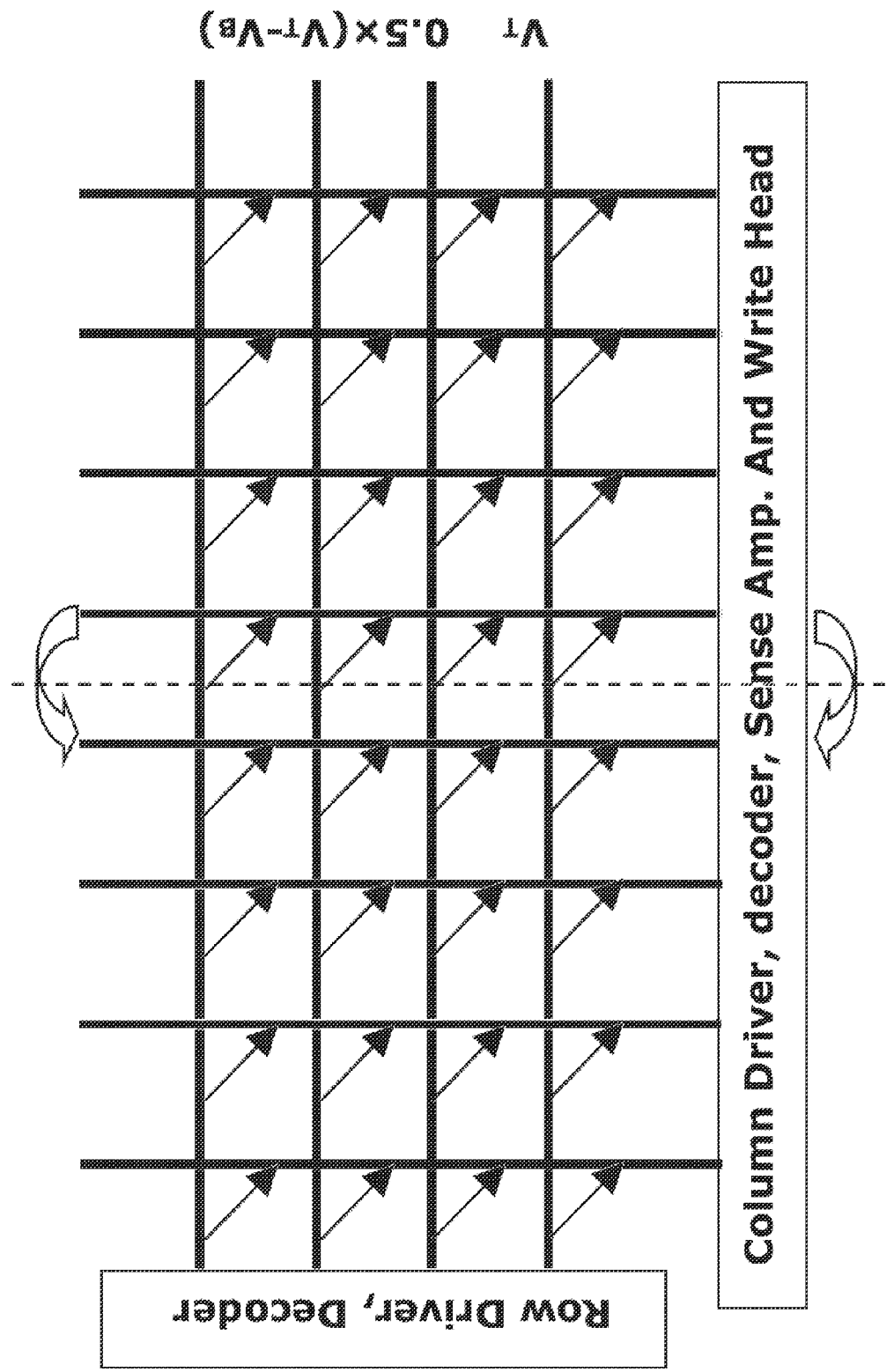
FIG. 7 is a diagram of an example configuration for a bipolar memory cell array including a bidirectional access diode in accordance with one embodiment of the present invention.

FIG. 7 is a diagram of an example bipolar memory cell array including a bidirectional access diode in accordance with one embodiment of the present invention. The horizontal lines represent the bit lines in the memory array. The vertical lines represent the word lines in the memory array. The memory cells are represented by the diagonal arrows pointing to the lower right.

In this embodiment, a row driver and row decoder are electrically coupled to each bit line. A column driver, column decoder, sense amplifier and write head are electrically coupled to each word line. In some embodiments, the four word lines on the right are arranged on top of the four word lines on the left, with the bit lines shared between them.

Figure 8A:
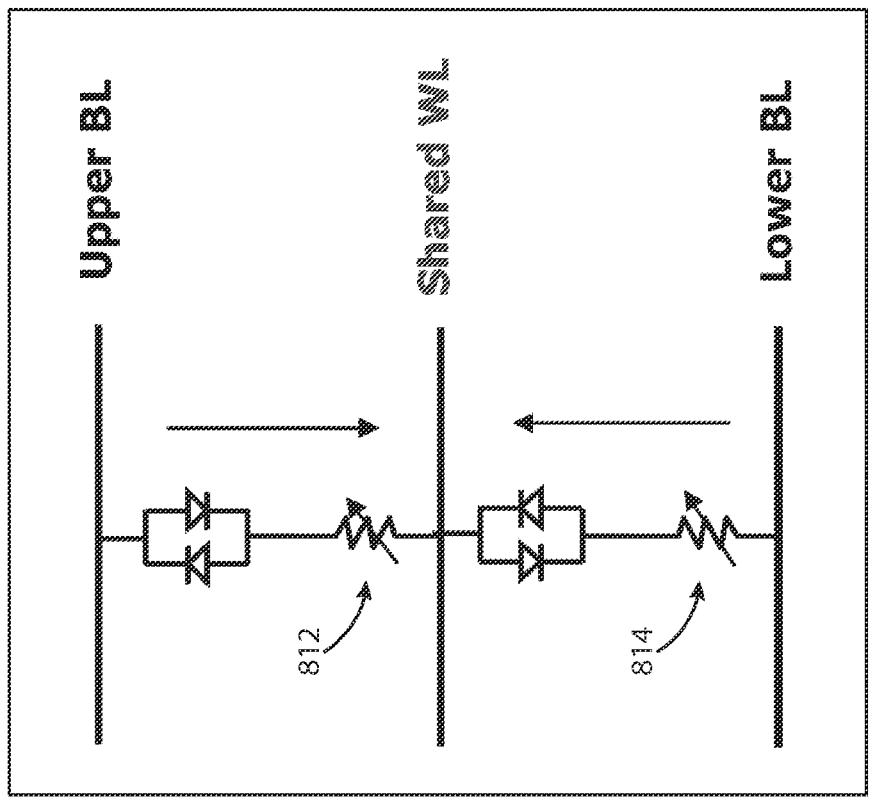
FIG. 8A is a diagram of an example configuration for a three-dimensional bipolar memory cell array including a bidirectional access diode in accordance with one embodiment of the present invention.

FIG. 8A is a diagram of an example configuration for a bipolar memory cell array including a bidirectional access diode in accordance with one embodiment of the present invention. In this embodiment two levels of memory cells are embedded between three metal layers. A column driver ($M_n$) is shared between a first memory cell 802 and a second memory cell 804. The first memory cell 802 is coupled to a first row driver ($M_{n+1}$). The second memory cell 804 is coupled to a second row driver ($M_{n-1}$). One skilled in the art would recognize that a row driver could take the place of the column driver, if a first and a second column driver could replace the row drivers.

Figure 8B:
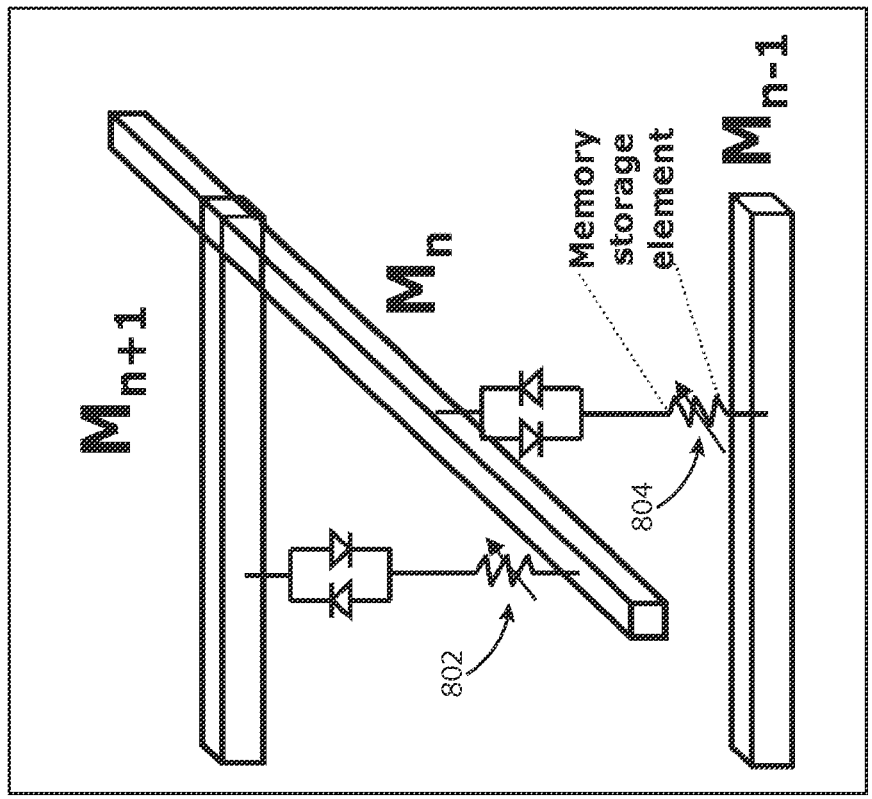
FIG. 8B is a diagram of an example configuration for a three-dimensional bipolar memory cell array including a bidirectional access diode in accordance with one embodiment of the present invention.

FIG. 8B is a diagram of another example configuration for a bipolar memory cell array including a bidirectional access diode in accordance with one embodiment of the present invention. In this embodiment, two levels of memory cells are embedded between three metal layers. A shared word line (Shared WL) is shared between a first memory cell 812 and a second memory cell 814. The first memory cell 812 is coupled to a first bit line (Upper BL). The second memory cell 814 is coupled to a second bit line (Lower BL).

FIG. 9 is a table of an optimized power supply scheme for a bipolar memory cell including a bidirectional access diode in accordance with one embodiment of the present invention. In this embodiments $V_{DD}$ is equal to double $V_{SBB}$, and $V_{PP}$ is equal to the sum of $V_{SBB}$ and $V_{SBW}$. The number of supply voltages is minimized in this embodiment. Additionally, the voltage swing from a standby state to an active state is minimized in this embodiment.

Figure 10:
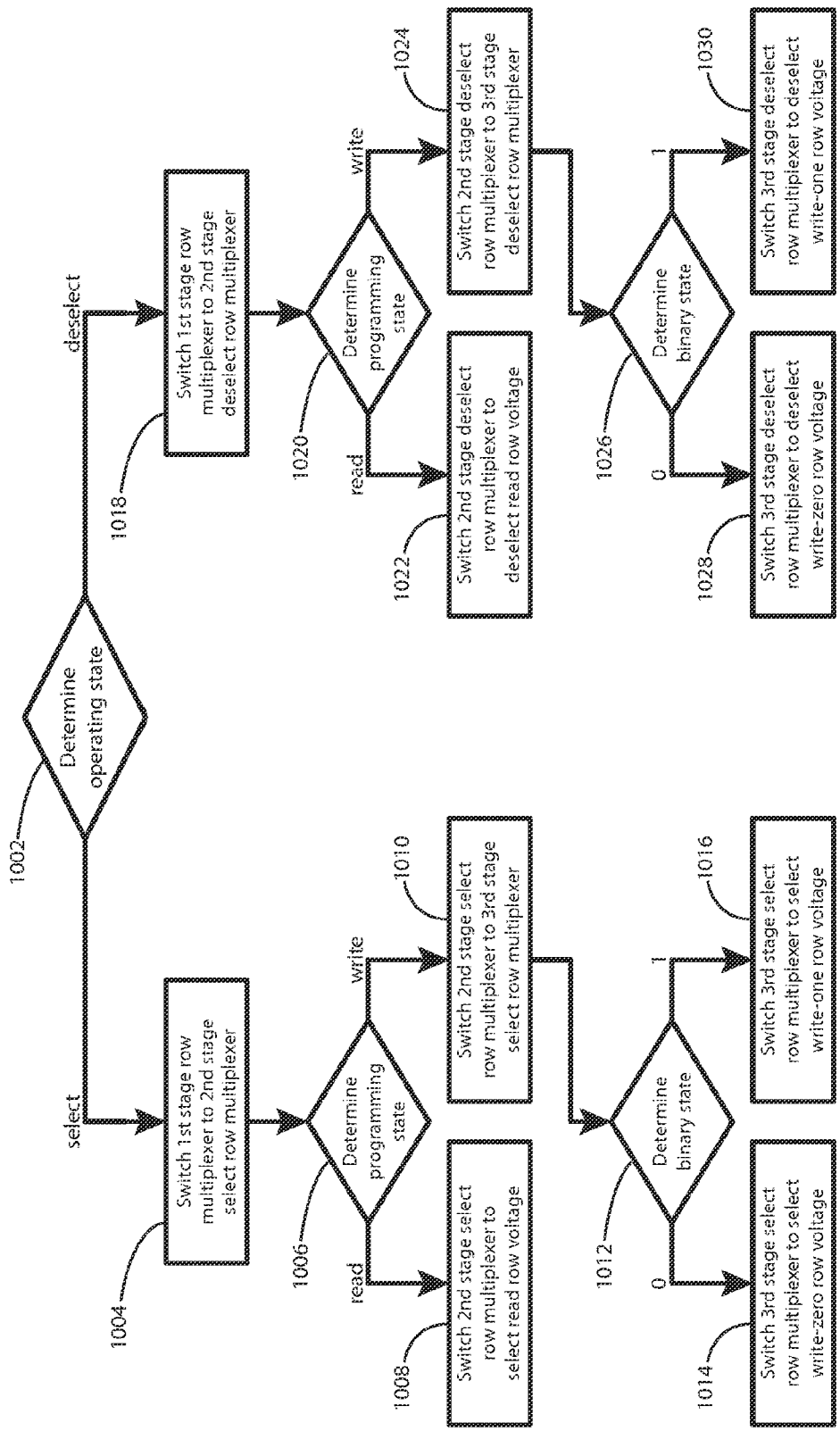
FIG. 10 is a flowchart illustrating an example method of operating a row switch for a bipolar memory cell array including a bidirectional access diode in accordance with one embodiment of the present invention.

FIG. 10 is a flowchart illustrating an example method of operating a row switch for a bipolar memory cell array including a bidirectional access diode in accordance with one embodiment of the present invention. This method is described with reference to decoding circuit 300. The method begins with determining step 1002. At determining step 1002, the operating state of the bipolar memory cell is determined as one of a select-state or a deselect-state.

If the operating state is one of a select state, the method proceeds to switching step 1004. At switching step 1004, the output signal of the first stage row multiplexer 304 is switched to a second stage select row multiplexer 308. After switching step 1004, the method proceeds to determining step 1006.

At determining step 1006, the programming state of the bipolar memory cell is determined as one of a read-state or a write-state. If the programming state is one of a read-state, the method proceeds to switching step 1008. At switching step 1008, the output signal of the second stage select row multiplexer 308 is switched to a select read row voltage 314. After switching step 1008, the method is complete.

If the programming state is one of a write-state, the method proceeds to switching step 1010. At switching step 1010, the output signal of the second stage select row multiplexer 308 is switched to a third stage select row multiplexer 316. After switching step 1010, the method proceeds to determining step 1012.

At determining step 1012, the binary state of the bipolar memory cell is determined as one of a write-zero state or a write-one state. If the binary state is one of a write-zero state, the method proceeds to switching step 1014. At switching step 1014, the third stage select row multiplexer 316 is switched to a select write-zero row voltage 320. After switching step 1014, the method is complete.

If the binary state is one of a write-one state, the method proceeds to switching step 1016. At switching step 1016, the third stage select row multiplexer 316 is switched to a select write-one row voltage 318. After switching step 1016, the method is complete.

If the operating state is one of a deselect state, the method proceeds to switching step 1018. At switching step 1018, the output signal of the first stage row multiplexer 304 is switched to a second stage deselect row multiplexer 310. After switching step 1018, the method proceeds to determining step 1020.

At determining step 1020, the programming state of the bipolar memory cell is determined as one of a read-state or a write-state. If the programming state is one of a read-state, the method proceeds to switching step 1022. At switching step 1022, the output signal of the second stage deselect row multiplexer 310 is switched to a deselect read row voltage 322. After switching step 1022, the method is complete.

If the programming state is one of a write-state, the method proceeds to switching step 1024. At switching step 1024, the output signal of the second stage deselect row multiplexer 310 is switched to a third stage deselect row multiplexer 324. After switching step 1024, the method proceeds to determining step 1026.

At determining step 1026, the binary state of the bipolar memory cell is determined as one of a write-zero state or a write-one state. If the binary state is one of a write-zero state, the method proceeds to switching step 1028. At switching step 1028, the third stage deselect row multiplexer 324 is switched to a deselect write-zero row voltage 328. After switching step 1028, the method is complete.

If the binary state is one of a write-one state, the method proceeds to switching step 1030. At switching step 1030, the third stage deselect row multiplexer 324 is switched to a deselect write-one row voltage 326. After switching step 1030, the method is complete.

Figure 11:
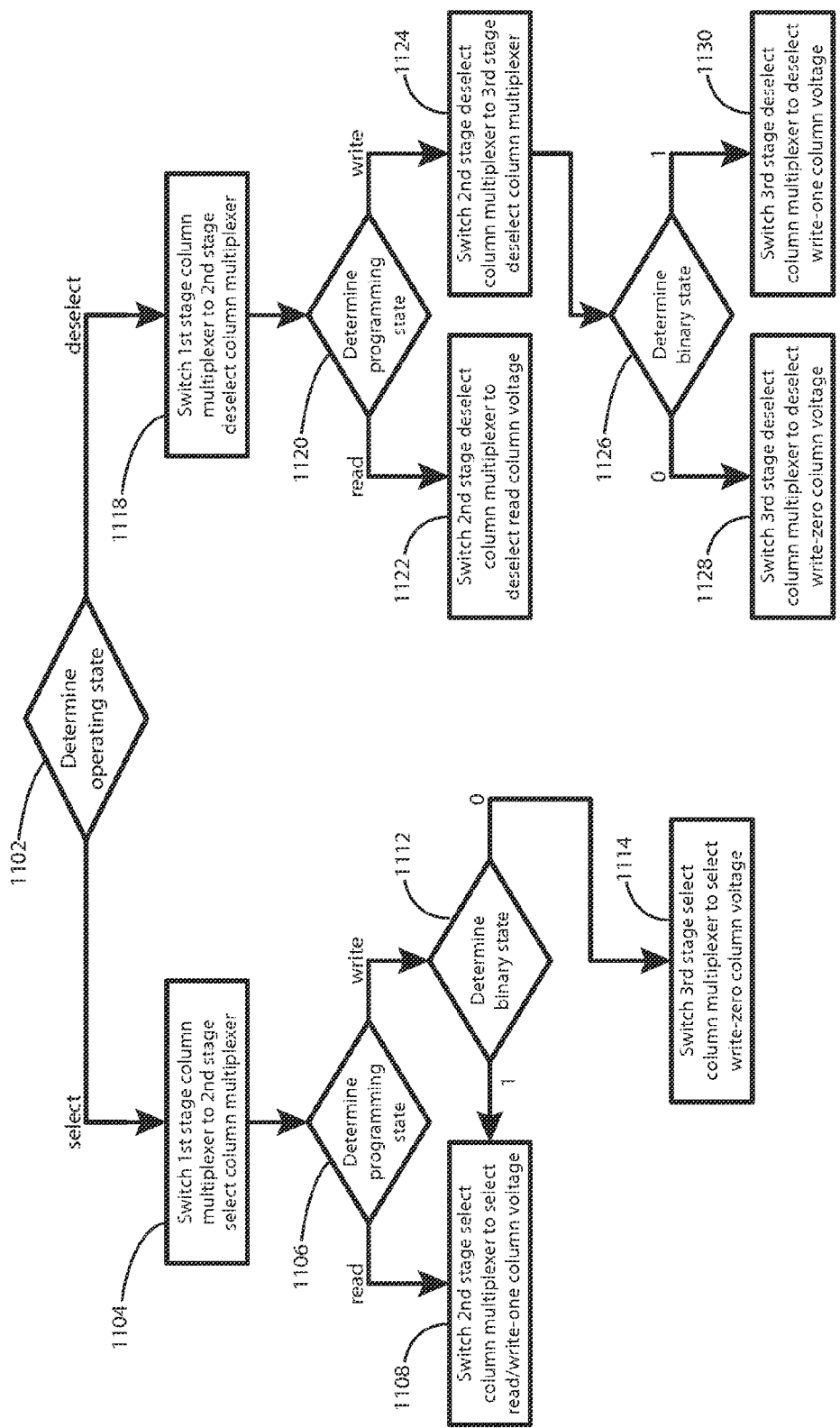
FIG. 11 is a flowchart illustrating an example method of operating a column switch for a bipolar memory cell array including a bidirectional access diode in accordance with one embodiment of the present invention.

FIG. 11 is a flowchart illustrating an example method of operating a column switch for a bipolar memory cell array including a bidirectional access diode in accordance with one embodiment of the present invention. This method is described with reference to decoding circuit 300. The method begins with determining step 1102. At determining step 1102, the operating state of the bipolar memory cell is determined as one of a select-state or a deselect-state.

If the operating state is one of a select state, the method proceeds to switching step 1104. At switching step 1104, the output signal of the first stage column multiplexer 334 is switched to a second stage select column multiplexer 338. After switching step 1104, the method proceeds to determining step 1106.

At determining step 1106, the programming state of the bipolar memory cell is determined as one of a read-state or a write-state. If the programming state is one of a read-state, the method proceeds to switching step 1108. At switching step 1108, the output signal of the second stage select column multiplexer 338 is switched to a select read/write-one column voltage 344. After switching step 1108, the method is complete.

If the programming state is one of a write-state, the method proceeds to determining step 1112. At determining step 1112, the binary state of the bipolar memory cell is determined as one of a write-zero state or a write-one state. If the binary state is one of a write-zero state, the method proceeds to switching step 1114. At switching step 1114, the second stage select column multiplexer 338 is switched to a select write-zero column voltage 346. After switching step 1114, the method is complete.

If the binary state is one of a write-one state, the method proceeds to switching step 1108. At switching step 1108, the output signal of the second stage select column multiplexer 338 is switched to a select read/write-one column voltage 344. After switching step 1108, the method is complete.

If the operating state is one of a deselect state, the method proceeds to switching step 1118. At switching step 1118, the output signal of the first stage column multiplexer 334 is switched to a second stage deselect column multiplexer 340. After switching step 1118, the method proceeds to determining step 1120.

At determining step 1120, the programming state of the bipolar memory cell is determined as one of a read-state or a write-state. If the programming state is one of a read-state, the method proceeds to switching step 1122. At switching step 1122, the output signal of the second stage deselect column multiplexer 340 is switched to a deselect read column voltage 348. After switching step 1122, the method is complete.

If the programming state is one of a write-state, the method proceeds to switching step 1124. At switching step 1124, the output signal of the second stage deselect column multiplexer 340 is switched to a third stage deselect column multiplexer 350. After switching step 1124, the method proceeds to determining step 1126.

At determining step 1126, the binary state of the bipolar memory cell is determined as one of a write-zero state or a write-one state. If the binary state is one of a write-zero state, the method proceeds to switching step 1128. At switching step 1128, the third stage deselect column multiplexer 350 is switched to a deselect write-zero column voltage 354. After switching step 1128, the method is complete.

If the binary state is one of a write-one state, the method proceeds to switching step 1130. At switching step 1130, the third stage deselect column multiplexer 350 is switched to a deselect write-one column voltage 352. After switching step 1130, the method is complete.

Furthermore, one skilled in the art would recognize that the number of multiplexers can vary based on optimization of the power domain. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A system for operating a bipolar memory cell array including a bidirectional access diode, the system comprising:
 a column voltage switch including a plurality of column voltages, wherein the column voltage switch includes an output electrically coupled to the bidirectional access diode;
 wherein the plurality of column voltages includes at least a write-one column voltage and at least a write-zero column voltage;
 a row voltage switch including a plurality of row voltages, the row voltage switch includes an output electrically coupled to the bidirectional access diode;
 wherein the plurality of row voltages includes at least a write-one row voltage and at least a write-zero row voltage;
 a column decoder electrically coupled to a select line of the column voltage switch;
 a row decoder electrically coupled to a select line of the row voltage switch; and
 a write driver electrically coupled to a select line of the column voltage switch and the row voltage switch; and
 wherein the column voltage switch includes a first stage column multiplexer electrically coupled to an output of a second stage column switch, the first stage column multiplexer includes an output electrically coupled to the bidirectional access diode;
 wherein the second stage column switch is electrically coupled to a third stage column switch, the second stage switch includes a second stage select column multiplexer and a second stage deselect column multiplexer; and wherein the third stage column switch includes a third stage deselect column multiplexer and the plurality of column voltages.

2. The system of claim 1, wherein the memory cell array utilizes at least one of a spin-transfer torque memory cell, resistive memory cell, solid-electrolyte memory cell, and organic memory cell.

3. The system of claim 1
wherein the row voltage switch includes a first stage row multiplexer electrically coupled to an output of a second stage row switch, the first stage row multiplexer includes an output electrically coupled to the bidirectional access diode;
wherein the second stage row switch is electrically coupled to a third stage row switch, the second stage switch includes a second stage select row multiplexer and a second stage deselect row multiplexer; and
wherein the third stage row switch includes a third stage select row multiplexer, a third stage deselect row multiplexer and the plurality of row voltages.

4. The system of claim 3
wherein the second stage select column multiplexer is electrically coupled to a select read/write-one column voltage and a select write-zero column voltage, the second stage select column multiplexer includes an output electrically coupled to the first stage column multiplexer; and
wherein the second stage deselect column multiplexer is electrically coupled to a deselect read column voltage and an output of the third stage deselect column multiplexer, the second stage deselect column multiplexer includes an output electrically coupled to the first stage column multiplexer.

5. The system of claim 4
wherein the second stage select row multiplexer is electrically coupled to a select read row voltage and an output of the third stage select row multiplexer, the second stage select row multiplexer includes an output electrically coupled to the first stage row multiplexer; and
wherein the second stage deselect row multiplexer is electrically coupled to a deselect read row voltage and an output of the third stage deselect row multiplexer, the second stage deselect row multiplexer includes an output electrically coupled to the first stage row multiplexer.

6. The system of claim 5
wherein the third stage deselect column multiplexer is electrically coupled to a deselect write-one column voltage and a deselect write-zero column voltage;
wherein the third stage select row multiplexer is electrically coupled to a select write-one row voltage and a select write-zero row voltage; and
wherein the third stage deselect row multiplexer is electrically coupled to a deselect write-one row voltage and a deselect write-zero row voltage.

7. The system of claim 6, wherein the bidirectional access diode includes a threshold voltage in each bias direction.

8. The system of claim 7
wherein the read/write-one column voltage and the select write-zero row voltage are a ground voltage;
wherein the select write-zero column voltage and the select write-one row voltage are a write head voltage;
wherein the deselect read column voltage is equal to one half the sum of the select read row voltage and the threshold voltage;
wherein the deselect write-one column voltage and the deselect write-zero row voltage are equal to one half the sum of the write head voltage and the threshold voltage;
wherein the deselect write-zero column voltage and the deselect write-one row voltage are equal to one half the difference between the write head voltage and the threshold voltage; and
wherein the deselect read row voltage is equal to half the difference between the select read row voltage and the threshold voltage.

9. The system of claim 8
wherein the second stage column switch and the third stage column switch is electrically coupled to a plurality of first stage column multiplexers; and
wherein the second stage row switch and the third stage row switch is electrically coupled to a plurality of first stage row multiplexers.

10. The system of claim 8, wherein the row voltage switch is shared between a first column voltage switch, first bidirectional access diode, a second column voltage switch, and second bidirectional access diode.

11. The system of claim 8, wherein the column voltage switch is shared between a first row voltage switch, first bidirectional access diode, a second row voltage switch, and second bidirectional access diode.

12. A method for operating a bipolar memory cell array including a bidirectional access diode, the method comprising:
determining if an operating state of a bipolar memory cell is one of a select-state and a deselect-state;
determining if a programming state of the bipolar memory cell is one of a read-state and a write-state;
determining if a binary state of the bipolar memory cell is one of a one-state and a zero-state;
switching an output signal of a column voltage switch to a select read/write-one column voltage if the operating state is the select-state and the programming state is the read-state;
switching the output signal of the column voltage switch to the select read/write-one column voltage if the operating state is the select-state, the programming state is the write-state, and the binary state is the one-state;
switching the output signal of the column voltage switch to a select write-zero column voltage if the operating state is the select-state, the programming state is the write-state, and the binary state is the zero-state;
switching the output signal of the column voltage switch to a deselect read column voltage if the operating state is the deselect-state and the programming state is the read-state;
switching the output signal of the column voltage switch to a deselect write-one column voltage if the operating state is the deselect-state, the programming state is the write-state, and the binary state is the one-state;
switching the output signal of the column voltage switch to a deselect write-zero column voltage if the operating state is the deselect-state, the programming state is the write-state, and the binary state is the zero-state;
switching an output signal of a row voltage switch to a select read row voltage if the operating state is the select-state and the programming state is the read-state;
switching the output signal of the row voltage switch to a select write-one row voltage if the operating state is the select-state, the programming state is the write-state, and the binary state is the one-state;
switching the output signal of the row voltage switch to a select write-zero row voltage if the operating state is the select-state, the programming state is the write-state, and the binary state is the zero-state;

switching the output signal of the row voltage switch to a deselect read row voltage if the operating state is the deselect-state and the programming state is the read-state;
switching the output signal of the row voltage switch to a deselect write-one row voltage if the operating state is the deselect-state, the programming state is the write-state, and the binary state is the one-state; and
switching the output signal of the row voltage switch to a deselect write-zero row voltage if the operating state is the deselect-state, the programming state is the write-state, and the binary state is the zero-state.

13. The method of claim 12, further comprising:
switching an output signal of a first stage column multiplexer to a second stage select column multiplexer if the operating state is the select-state;
switching an output signal of the first stage column multiplexer to a second stage deselect column multiplexer if the operating state is the deselect-state;
switching an output signal of a first stage row multiplexer to a second stage select row multiplexer if the operating state is the select-state; and
switching an output signal of the first stage row multiplexer to a second stage deselect row multiplexer if the operating state is the deselect-state.

14. The method of claim 13, further comprising:
switching an output signal of a second stage select column multiplexer to a select read/write-one column voltage if the operating state is the select state and the programming state is the read-state;
switching an output signal of the second stage select column multiplexer to a select read/write-one column voltage if the operating state is the select-state, the programming state is the write-state and the binary state is a one-state; and
switching an output signal of the second stage select column multiplexer to a select write-zero column voltage if the operating state is the select-state, the programming state is the write-state and the binary state is a zero-state.

15. The method of claim 14, further comprising:
switching an output signal of a second stage deselect column multiplexer to a deselect read column voltage if operating state is the deselect-state and the programming state is the read-state; and
switching an output signal of the second stage deselect column multiplexer to a third stage deselect column multiplexer if the operating state is the deselect-state and the programming state is the write-state.

16. The method of claim 15, further comprising:
switching an output signal of a second stage select row multiplexer to a select read row voltage if operating state is the select-state and the programming state is the read-state; and
switching an output signal of the second stage select row multiplexer to a third stage select row multiplexer if the operating state is the select-state and the programming state is the write-state.

17. The method of claim 16, further comprising:
switching an output signal of a second stage deselect row multiplexer to a deselect read row voltage if operating state is the deselect-state and the programming state is the read-state; and
switching an output signal of the second stage deselect row multiplexer to a third stage deselect row multiplexer if the operating state is the deselect-state and the programming state is the write-state.

18. The method of claim 17, further comprising:
switching an output signal of a third stage deselect column multiplexer to a deselect write-one column voltage if the operating state is the deselect-state, the programming state is the write-state and the binary state is the one-state; and
switching the output signal of the third stage deselect column multiplexer to a deselect write-zero column voltage if the operating state is the deselect-state, the programming state is the write-state and the binary state is the zero-state.

19. The method of claim 18, further comprising:
switching an output signal of a third stage select row multiplexer to a select write-one row voltage if the operating state is the select-state, the programming state is the write-state and the binary state is the one-state;
switching the output signal of the third stage select row multiplexer to a select write-zero row voltage if the operating state is the select-state, the programming state is the write-state and the binary state is the zero-state;
switching an output signal of a third stage deselect row multiplexer to a deselect write-one row voltage if the operating state is the deselect-state, the programming state is the write-state and the binary state is the one-state; and
switching the output signal of the third stage deselect row multiplexer to a deselect write-zero row voltage if the operating state is the deselect-state, the programming state is the write-state and the binary state is the zero-state.

20. The system of claim 19, wherein the bidirectional access diode includes a threshold voltage.

21. The system of claim 20
wherein the read/write-one column voltage and the select write-zero row voltage are a ground voltage;
wherein the select write-zero column voltage and the select write-one row voltage are a write head voltage;
wherein the deselect read column voltage is equal to one half the sum of the select read row voltage and the threshold voltage;
wherein the deselect write-one column voltage and the deselect write-zero row voltage are equal to one half the sum of the write head voltage and the threshold voltage;
wherein the deselect write-zero column voltage and the deselect write-one row voltage are equal to one half the difference between the write head voltage and the threshold voltage; and
wherein the deselect read row voltage is equal to half the difference between the select read row voltage and the threshold voltage.

* * * * *